United States Patent [19]

Kozlovsky et al.

[11] Patent Number: 5,077,748
[45] Date of Patent: Dec. 31, 1991

[54] LASER SYSTEM AND METHOD

[75] Inventors: William J. Kozlovsky, Mountain View; Wilfried Lenth, Capitola, both of Calif.

[73] Assignee: International Business Machines Corporation, Armonk, N.Y.

[21] Appl. No.: 678,397

[22] Filed: Apr. 1, 1991

[51] Int. Cl.[5] .............................................. H01S 3/10
[52] U.S. Cl. ..................................... 372/22; 372/21; 372/32; 372/29; 359/326; 359/327; 359/328
[58] Field of Search ....................... 372/21, 22, 29, 32; 307/425, 426, 427

[56] References Cited

U.S. PATENT DOCUMENTS

| | | | |
|---|---|---|---|
| 4,815,851 | 3/1989 | Soohoo | 356/350 |
| 4,856,010 | 8/1989 | Wissman et al. | 372/29 |
| 4,913,533 | 4/1990 | Kafka et al. | 372/22 |
| 4,958,354 | 9/1990 | Urakami et al. | 372/29 |

FOREIGN PATENT DOCUMENTS 141062 5/1985 Fed. Rep. of Germany .
1177719 7/1989 Japan .

OTHER PUBLICATIONS

M. K. Chun et al., *Applied Physics Letters*, vol. 55, p. 218, Jul. 17, 1989.
P. Gunther et al., *Applied Physics Letters*, vol. 35, pp. 461-463, Sep. 17, 1979.
A. Ashkin et al., *IEEE Journal of Quantum Electronics*, vol. QE-2, pp. 109-124, Jun. 1966.
W. Zapka, "Measuring Film Thicknesses and Surface Profiles by Frequency-Modulated Laser Beams", vol. 27, No. 1B, Jun. 1984, pp. 720-721, Technical Disclosure Bulletin.
T. M. Baer et al., *Conference on Lasers and Electro-Optics*, Paper THM5, Apr. 27, 1989.
G. J. Dixon et al., *Optic Letters*, vol. 14, pp. 731-733, Jul. 15, 1989.
W. J. Kozlovsky et al., *IEEE Journal of Quantum Electronics*, vol. 24, pp. 913-919, Jun. 1988.
R. W. P. Drever et al., *Applied Physics B*, vol. 31, pp. 97-105, 1983.
W. E. Moerner, "Frequency Modulation Heterodyne Spectroscopy with a Spatially-Separated Carrier Beam", Technical Disclosure Bulletin, vol. 28, Dec. 1985.

*Primary Examiner*—Georgia Epps
*Attorney, Agent, or Firm*—Douglas R. Millett

[57] ABSTRACT

A laser diode produces a laser beam having a carrier frequency component and a sideband frequency component. An optical resonator receives the laser beam and substantially couples the carrier frequency component and substantially rejects the sideband frequency component. An electronic locking system receives the rejected sideband frequency component and adjusts the laser diode to lock the carrier frequency component to the resonator frequency. A laser control controls the allocation of power between the carrier frequency and the sideband frequency component such that the resonator output may be controlled and pulsed.

25 Claims, 5 Drawing Sheets

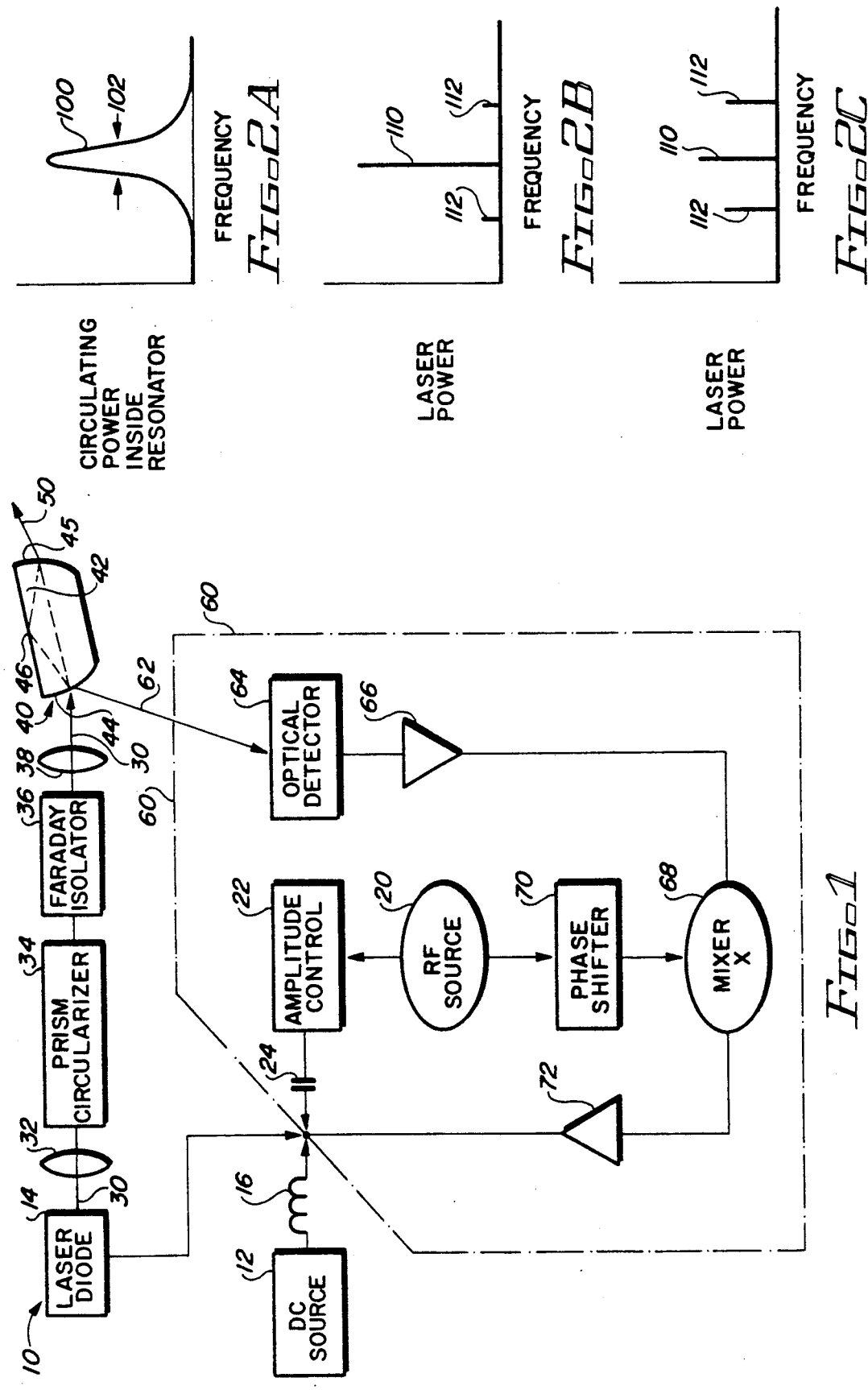

LASER SYSTEM AND METHOD

BACKGROUND OF THE INVENTION

1. Field of the Invention

This invention relates to laser systems and more particularly to laser systems which produce frequency doubled light.

2. Description of the Prior Art

Semiconductor diode lasers are of interest for a number of applications such as optical data storage, laser printing, and biochemical analysis. One example is the gallium-aluminum-arsenide (GaAlAs) diode laser which generates laser light in the near-infrared range (750-860 nm in wavelength). In optical data storage systems, the light from the laser diode is focused onto a spot on the optical disk in order to record each bit of data. The spot size is equal to approximately $\lambda/(2*(N.A.))$, where $\lambda$ is the wavelength of the light and (N.A.) is the numerical aperture of the focusing lens. In typical systems, the (N.A.) is approximately 0.5 and the resulting spot size is approximately 800 nm in diameter.

It is apparent that if the wavelength of the laser light can be cut in half, the diameter of the spot size will also be cut in half and the overall storage density on the optical disk may be quadrupled. Unfortunately, laser diodes that produce light in the blue wavelength range (430 nm in wavelength) are not available.

One technique to convert light to a higher frequency (shorter wavelength) is known as second harmonic generation (SHG). A laser beam at a first lower frequency is passed through a nonlinear crystal, such as potassium niobate ($KNbO_3$), which produces a second harmonic laser beam (i.e., a beam at twice the frequency of the original laser beam which entered the nonlinear crystal). This SHG technique is discussed in articles by M.K. Chun, et al., *Applied Physics Letters*, Vol. 55, p. 218, July 17, 1989; and P. Gunter, et al., *Applied Physics Letters*, Vol. 35, p. 461, Sept. 15, 1979. However, since the diode laser's output power is low, techniques to improve the second harmonic generation efficiency are required in order to produce a useful and efficient laser system.

One way to increase the efficiency of the SHG scheme is to place an optical resonator or cavity around the nonlinear crystal. The light is reflected back and forth through the crystal inside the resonator in order to generate a substantial amount of the blue light. This technique was originally proposed and demonstrated by Ashkin, et al., *IEEE Journal of Quantum Electronics*, Vol. QE-2, p. 109, 1966. Other examples include Goldberg, et al., *Applied Physic Letters*, Vol. 55, p. 218, 1989; and Baer, et al., Conference on Lasers and Electro-Optics, Paper THM5, 1989. Frequency doubling of GaAlAs diode lasers using a build-up cavity containing a nonlinear crystal such as potassium niobate ($KNbO_3$) offers the potential for the design of simple, compact laser systems. For the build up to occur, the external cavity resonance frequency must match the diode laser frequency. Otherwise, fluctuations of the power coupled to the resonator can cause substantial fluctuations in the resulting blue laser output. Some means must be used to either control the laser frequency or the resonator frequency to maintain the frequency matching so that a stable, useful laser output can result.

Some examples of frequency matching techniques are shown in Dixon, et al., *Optics Letters*, Vol. 14, p. 731, 1989; R.W.P Drever, et al., *Applied Physics B*, Vol. 31, p. 97, 1983; and W.J. Kozlovsky, et al., *IEEE Journal of Quantum Electronics*, Vol. 24, p. 913, 1988. Another system is shown in a co-pending U.S. Patent Application filed Oct. 15, 1990 by the same inventors as the present invention. All of these systems experience problems in maintaining the frequency matching when the laser output must be pulsed or the power level varied. Pulsing of the laser output is a requirement for certain applications such as optical data storage. Pulsing of the diode laser input current causes the frequency of the laser light to shift away from the resonance frequency of the resonator cavity. The laser becomes unlocked from the frequency of the resonator and the system no longer produces any SHG light. SHG light will only be generated when the input current and the laser frequency is restored and stabilized to its previous value. The result is that pulsing of the entire system is relatively slow. Also, the system cannot provide SHG light at more than one power level. What is needed is a laser and nonlinear cavity system which allows for high speed pulse operation and allows for variable control of the SHG light power level.

SUMMARY OF THE INVENTION

In a preferred embodiment of the present invention, a diode laser is driven by a combination of a direct current (DC) source and a radio frequency (RF) source. The diode laser produces an infrared light beam comprised of a carrier frequency component and sideband frequency components. The light beam is passed through a collimating lens, a circularizing prism, a Faraday Isolator and a focusing lens. The focusing lens directs the light to a nonlinear cavity resonator. The infrared carrier frequency light is coupled into the resonator and by second harmonic generation (SHG) is converted into blue light which is output by the cavity resonator.

The sideband frequency light components are substantially reflected and the carrier frequency component is partially reflected at the entrance to the resonator cavity and these components are detected by an optical detector. The detector produces a detector signal which is mixed with the original RF source signal to produce an error signal. The error signal is then received by the diode laser which adjusts the frequency of the carrier frequency component to remain matched to the resonance frequency of the resonator.

An amplitude modulator is connected between the RF source and the laser diode. The amplitude modulator adjusts the amplitude of the RF signal entering the laser diode. Increasing the RF amplitude results in an increase in the sideband component and a corresponding decrease in the carrier frequency component. The light in the sideband component is substantially rejected by the resonator and only the reduced carrier frequency light component is received. The result is that by increasing the amplitude of the RF signal, the blue light output power will be reduced. Similarly, by decreasing the amplitude of the RF signal, the blue light output power will increase. This output control may be used to maintain constant blue light power in spite of fluctuations in operating parameters such as diode laser output power or crystal phasematching temperature that would otherwise cause blue light power fluctuations. This output control may also be used to pulse the output power between two distinct levels, such as between a high power level and a low power level for purposes of optical storage writing. The carrier frequency will maintain its lock on the resonance frequency of the cavity even during the pulsing operation. The result is a distinct and clear pulsed blue light source.

For a fuller understanding of the nature and advantages of the present invention, reference should be made to the following detailed description taken in conjunction with the accompanying drawings.

BRIEF DESCRIPTION OF THE DRAWINGS

FIG. 1 shows a schematic diagram of the laser system of the present invention;

FIG. 2A shows a graph of circulating power versus frequency for the resonator cavity;

FIG. 2B shows a graph of laser power versus frequency for the laser diode output light beam at a first state;

FIG. 2C shows a graph of laser power versus frequency for the laser diode output light beam at a second state;

DESCRIPTION OF THE PREFERRED EMBODIMENTS

Figure 3A:
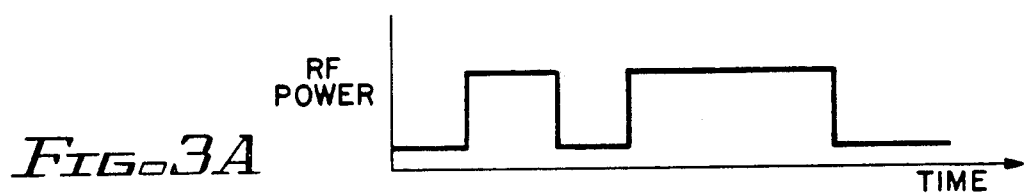
FIG. 3A shows a graph of RF power versus time.

FIG. 1 shows a laser system of the present invention and is designated by the general reference number 10. System 10 comprises a DC power source 12. Source 12 is connected to a laser diode 14 via an inductor 16. In a preferred embodiment, the DC source 12 outputs a DC current of 50-200 milliamps.

A RF source 20 is connected to an amplitude control 22. RF source 20 preferably produces a RF signal in the range of 100-1,000 MHz with an output power of 10-23 dBm so as to produce a maximum peak-to-peak RF current in the laser diode 14 of approximately 20 mA. Amplitude control 22 is connected to laser diode 14 via a capacitor 24. Capacitor 24 is used to block the DC current from DC source 12 from entering the RF source 20. Similarly, inductor 16 is used to block the RF current from RF source 20 from entering DC source 12. The DC source 12 and RF source 20 provide a DC current signal and an RF current signal, respectively, which combine to form an injection current to the has a carrier frequency component and sideband frequency components.

In a preferred embodiment of the present invention, the diode laser 14 is a ridge waveguide, single quantum well, graded index, double heterostructure, GaAlAs diode laser grown by a molecular beam epitaxy. The laser diode 14 operates in a single axial mode which can be tuned to 856 nm by adjusting the temperature. With an injection current of 195 milliamps, the single mode output power is 160 milliwatts. Although the preferred embodiment of the present invention uses infrared light other types of electromagnetic radiation may also be used.

Light beam 30 is collimated by a lens 32 and is circularized by a circularizing prism 34. The light 30 is then passed through a Faraday Isolator 36. Faraday Isolator 36 is used to prevent back reflected light and scattered light from reaching diode laser 14. A lens 38 couples the light 30 into the fundamental spatial mode of a nonlinear crystal resonator cavity 40.

In a specific embodiment, the diode laser output is collimated with an 8.6 mm focal length lens and circularized with a 3x anamorphic prism pair. The diode laser radiation is coupled into the fundamental mode of the nonlinear resonator 40 using a lens with a focal length of 250 mm for spatial mode matching. The overall transmission of the optics is 66% so that a maximum 856 nm power of 105 milliwatts is incident on the nonlinear crystal resonator 40. Spatial mode matching is discussed in more detail in the article "Laser Beams and Resonators," *Applied Optics*, Vol. 5, pp. 1550-1567, Oct. 1966.

Nonlinear resonator 40 is fabricated from a nonlinear crystal material 42, such as potassium niobate ($KNbO_3$). The specific material 42 is shaped as an elongated cylinder having a length in the range of about 2-10 mm. Crystal material 42 is polished to have two curved mirrors 44 and 45 at both ends and flat total internal reflection surface 46 parallel to the mirror axes. Mirrors 44 and 45 are formed of dielectric coatings of high reflectivity at the carrier frequency of the diode laser 14. Crystal material 42 is aligned with an orientation to receive the optically incident beam into the off axis ring path of the nonlinear resonator 40.

Mirror coating reflectivities are chosen for optimum coupling of the infrared diode laser radiation to the cavity, taking into account both the internal losses of the nonlinear crystal, i.e., round trip loss of approximately 2% in a specific embodiment of a 7 mm crystal length, and the anticipated losses due to SHG. This optimum coupling is known as impedance matching and is described in the article "Efficient Second Harmonic Generation of a Diode-Laser-Pumped Nd:YAG Laser," by W.M. Kozlovsky, et al., *IEEE J. Quantum Electronics*, Vol. QE-24, No. 6 p. 913, (1988). Crystal material 42 is oriented to permit phase matched, second harmonic generation (SHG) so that an output laser beam 50 at twice the frequency of laser beam 30 is generated. Beam 50 is a blue output beam (428 nm wavelength) when the laser diode source 14 is an 856 nm GaAlAs diode laser.

Nonlinear resonator 40 is shown as a monolithic ring cavity, although the use of the well known standing wave cavity or a discrete mirror design is also possible.

A typical linewidth frequency range) for such cavities is approximately 200MHz. For the stability of the non-critically phase matched frequency doubling, resonator 40 may be controlled by a thermo-electric cooler element for maintaining a stabilized temperature. In a preferred embodiment, in order to achieve phase matched frequency doubling of the 856 nm laser output, the potassium niobate crystal is maintained at 15° C.

Mirror 44 reflects a portion 62 of the beam 30 to an electronic resonance locking system 60 shown enclosed by a dotted line. The reflected portion 62 of the beam 30 is directed to an optical detector 64. Detector 64 generates a RF signal arising from the difference in phase shifts or amplitudes between the RF frequency sidebands and the carrier caused by any mismatch between the central carrier frequency component of beam 30 and the resonance frequency of resonator 40. Detector 64 is connected to an amplifier 66 and a RF mixer 68. The RF siqnal from the detector 64 is amplified by amplifier 66, and then coupled to the input of the RF mixer 68. A phase shifter 70 is connected between the RF source 20 and mixer 68. Phase shifter 70 adjusts the phase of the RF signal from RF source 20 so that the phase difference between the RF source 20 and the signal from amplifier 66 is preferably 90 degrees. RF mixer 68 receives the amplified RF signal from the detector 64 and mixes it with the signal from the phase shifter 70 for demodulation and generation of an error signal. This error signal is indicative of the matching of the carrier frequency component of the laser diode 14 and the resonator resonance frequency. The error signal is amplified by an amplifier 72. The error signal is then used as a feedback signal for tuning the laser injection current such that the carrier frequency component of laser diode 14 is automatically adjusted to match the resonance frequency of resonator 40. In a preferred embodiment, the error signal is added to the injection current entering the laser diode 14. Alternatively, the error signal could be used to adjust the diode laser's temperature in order to obtain frequency matching.

While blue light generation using potassium niobate and GaAlAs diode lasers have been used in a specific embodiment of the present invention, generation of other wavelengths such as green, violet, and ultraviolet are also possible using other components. Other nonlinear crystals such as lithium niobate, lithium equilibrated lithium niobate, lithium potassium niobate, lithium iodate, KTP, KTA, barium borate, LBO, and periodically poled KTP and lithium niobate will permit phase matched SHG using a number of different fundamental wavelengths. These fundamental wavelengths can be generated from various diode laser systems such as GaAlAs diode lasers, InGaAs strained-layer lasers, InGaAsP lasers, and AlGaInP lasers.

FIG. 2A shows a graph of circulating power versus frequency for the resonator 40 as a line 100. In a preferred embodiment, for a 7 mm long crystal, the linewidth or the full width at half the maximum (FWHM) 102 is 200MHz. The resonator has a multitude of resonance frequencies which occur at 10 Gigahertz intervals in the range around 349 TeraHz (856 nm wavelength). The system is FIG. 2B shows a graph of laser power versus frequency for the beam 30 when the RF signal amplitude control 22 is set such that the RF power signal entering laser diode 14 has a low amplitude. Line 110 represents the carrier frequency component and lines 112 represent the two sideband frequency components. In a preferred embodiment, the carrier frequency component is at approximately 349 TeraHz (856 nanometer wavelength) and the sideband frequency components are plus and minus 400 MHz from the carrier frequency component. The sidebands 112 are located outside of the linewidth of resonator 40 for optimum operation in the preferred embodiment. However, the invention will still work with the sidebands located within the resonator linewidth.

FIG. 2C shows a graph of laser power versus frequency for beam 30 when the RF signal from amplitude control 22 is set at a high amplitude. Note that the increase in RF amplitude causes a shift in power from the carrier component to the sideband components.

Figure 3B:
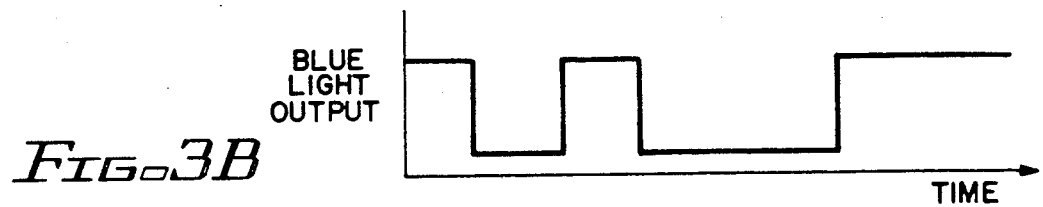
FIG. 3B shows a graph of blue light output versus time.

FIG. 3A is a graph of RF power versus time for the output of amplitude control 22. FIG. 3B is a graph of blue light output 50 versus time. Note that an increase of RF amplitude causes a decrease in blue light output.

Figure 4:
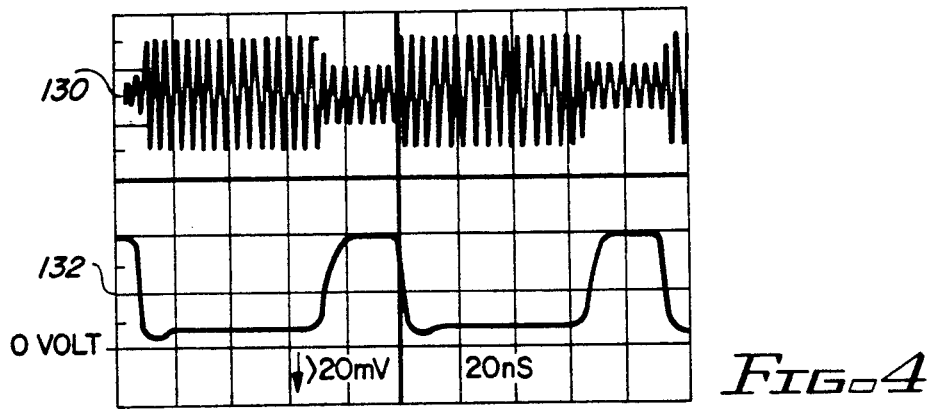
FIG. 4 shows an oscilliscope trace of the RF power coupled to the laser diode and the resonator blue light output.

FIG. 4 shows an oscilliscope tracing. Trace 130 represents the output RF current of amplitude control 22 and trace 132 represents the output blue light 50. The increasing RF amplitude causes a corresponding decrease in blue light output.

The operation of the present invention may now be understood. DC source 12 and RF source 20 provide an injection current to laser diode 14. The amplitude of the RF component of the injection current is controlled by amplitude control 22. Assume that initially the amplitude of the RF component is set low by the amplitude control 22 to produce approximately 0.1 to 1.0 mA peak-to-peak RF current in the laser diode.

Laser diode 14 produces beam 30. Beam 30 has a carrier frequency component 110 and two sideband frequency components 112 as a result of the RF current. See FIG. 2B. Beam 30 passes through lens 32, prism 34, Faraday Isolator 36, and lens 38 to resonator 40.

The carrier frequency component 110 has a frequency approximately equal to the maximum resonance frequency 100 of resonator 40 and will be readily coupled into resonator 40. The carrier frequency component is infrared light in the preferred embodiment and it will resonate in resonator 40 through nonlinear crystal 42. The infrared light will be converted to blue light 50 by SHG and will exit resonator 40.

The sideband frequency components 112 of beam 30 will be substantially rejected by resonator 40 because they are at a frequency outside of the resonance range. Instead, the sideband frequency components and some of the carrier frequency component are reflected by mirror 44 to detector 64. If the carrier component is located at the resonance frequency of the resonator 40, the carrier will experience a phaseshift upon reflection that is the same as the average phaseshift seen by the sideband components, and the reflected sidebands will be of equal magnitude. Since the RF signal generated by the beating of one sideband with the reflected carrier is 180 degrees out of phase compared to the RF signal generated by the beating of the other sideband and the carrier, the two RF signals cancel producing no net RF signal by detector 64. As a result, no error signal is produced by mixer 68.

However, if the carrier frequency component is near but not exactly at the resonance frequency of resonator 40, then the carrier will experience a phaseshift upon reflection different than the phaseshift experienced by the sidebands, such that the RF signal generated by the beating of one sideband with the carrier on the detector 64 will not be 180 degrees out of phase with the RF signal generated by the other sideband. The result is that a net RF signal is produced by detector 64. This RF signal from detector 64 is mixed with the original RF source signal by mixer 68 to produce an error signal. This error signal is added to the injection current to laser diode 14 and this adjusts the carrier frequency component to again lock to the resonator resonance frequency.

The output of blue light 50 may be varied or pulsed using the present invention. The amplitude control 22 is adjusted to allow a high amplitude RF signal to be injected to laser diode 14. The high amplitude RF signal produces approximately 10-20 mA peak-to-peak current in laser diode 14 in the preferred embodiment. See FIG. 2C. Now the slight increase in amplitude of the RF causes a large shift in power from the carrier frequency component 110 to the sideband frequency component 112. Since the sidebands 112 will be rejected by resonator 40, the blue light 50 output is decreased. The blue light 50 output is decreased by a factor of eight in the preferred embodiment.

The advantages of the present invention may now be understood. The system 10 allows the output blue light power to be easily pulsed or variably controlled by a slight variation in RF injection current. Varying the level of the RF injection current changes the ratio of the sideband frequency component to the carrier frequency component in beam 30. The main carrier frequency component remains locked to the resonator cavity resonance frequency even during the pulsed operation. This results in a clean and distinct series of pulses of blue output light. See FIG. 4.

Figure 5:
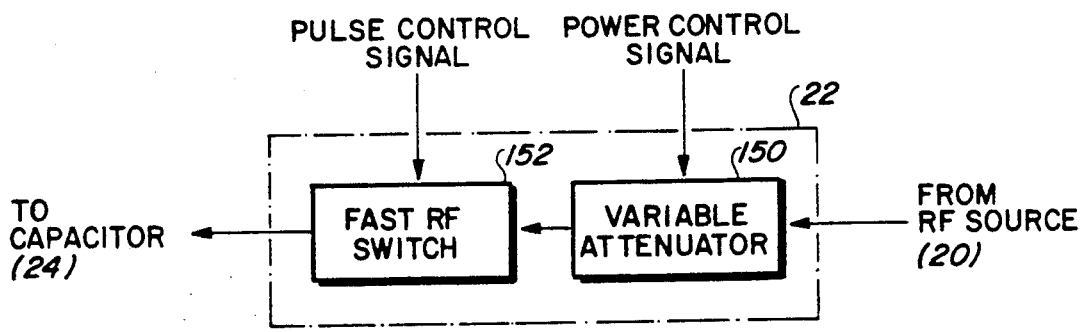
FIG. 5 shows a schematic diagram of a preferred embodiment of an amplitude control of the present invention.

FIG. 5 shows a preferred embodiment of the amplitude control 22 of system 10. Control 22 is comprised of a variable attenuator 150 and a fast RF switch 152. Attenuator 150 may be an Avantek UTF015 attenuator and RF switch 152 may be a Watkins & Johnson S-1 switch. Attenuator 150 is connected to RF source 20 and RF switch 152 is connected between attenuator 150 and capacitor 24.

The operation of control 22 may now be understood. When a steady state blue laser output is desired, a control signal is applied to switch 152 which causes switch 152 to remain closed. A power control signal is applied to attenuator 150 to control the attenuation of attenuator 150. Attenuator 150 decreases the amplitude of the RF signal from source 20. The result is that the amount of the sideband component in beam 30 and hence the output of beam 50 may be variably controlled by the power control signal. Increasing the attenuation of attenuator 150 decreases the RF component of the injection current to laser 14, decreasing the sideband component and increasing the carrier component of beam 30. The exact power level of the blue output light 50 which is desired is easily controlled by the power control signal.

When a pulsed blue output is desired, the pulse control signal causes switch 152 to rapidly open and close which in turn causes the blue light 50 to pulse. Switch 152 is operated in a leaky mode to allow a small amount of RF current to pass even when the switch is opened. This leaked RF current is sufficient to provide the small sideband component necessary for frequency locking. The attenuator 150 is adjusted to achieve a desired blue light output level. It should be noted that when the switch 152 is open, the blue light level will be at a maximum and when switch 152 is closed, the blue light level will be at a minimum. This pulsing operation is useful in a writing operation of an optical data storage system.

Figure 6:
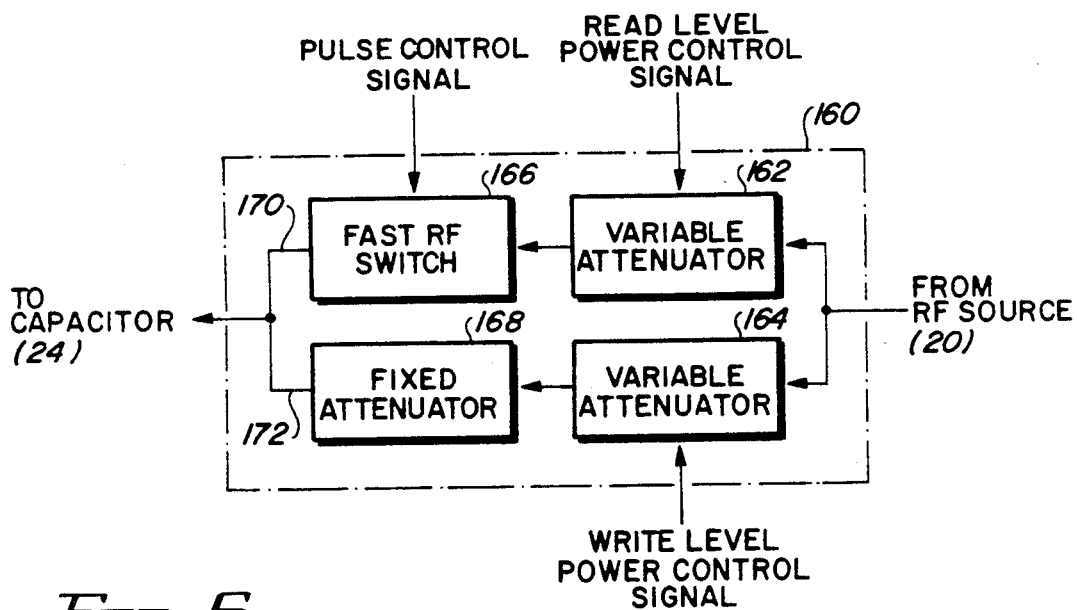
FIG. 6 shows a schematic diagram of an alternative embodiment of an amplitude control of the present invention suitable for optical storage applications.

FIG. 6 shows an alternative embodiment of an amplitude control and is designated by the general reference number 160. Amplitude control 160 may be substituted for control 22 of system 10. Control 160 is comprised of a pair of variable attenuators 162 and 164, a fast RF switch 166, and a fixed attenuator 168. Variable attenuator 162 and RF switch 166 are connected in series between source 20 and capacitor 24 along a path 170. Variable attenuator 164 and fixed attenuator 168 are connected in series between source 20 and capacitor 24 along a path 172. Paths 170 and 172 are of equal length such that their outputs are in phase. Variable attenuators 162 and 164 may be an Avantek UTF015 attenuators. Fast RF switch 166 may be a Watkins & Johnson S-1. A pulse control signal is applied to RF switch 166, a read level power control signal is applied to attenuator 162, and a write level power control signal is applied to attenuator 164.

The operation of control 160 may now be understood. When a steady state read blue light output beam is desired, switch 166 is set closed and variable attenuator 162 is set to the desired level. Most of the RF signal flows through path 170 and very little flows through path 172 due to the high attenuation of fixed attenuator 168. Attenuator 162 is adjusted until a blue light output having a desired read power level is produced. When a pulsed write signal is desired, switch 166 is opened and closed by the pulse control signal. When switch 166 is open, no current flows through path 170 and all the current flows through path 172. Variable attenuator 162 is set such that a very low power level (or no power) blue light beam is produced when switch 166 is closed. Variable attenuator 164 is set such that a high power blue light output beam (suitable for writing) is produced when switch 166 is open.

Figure 7:
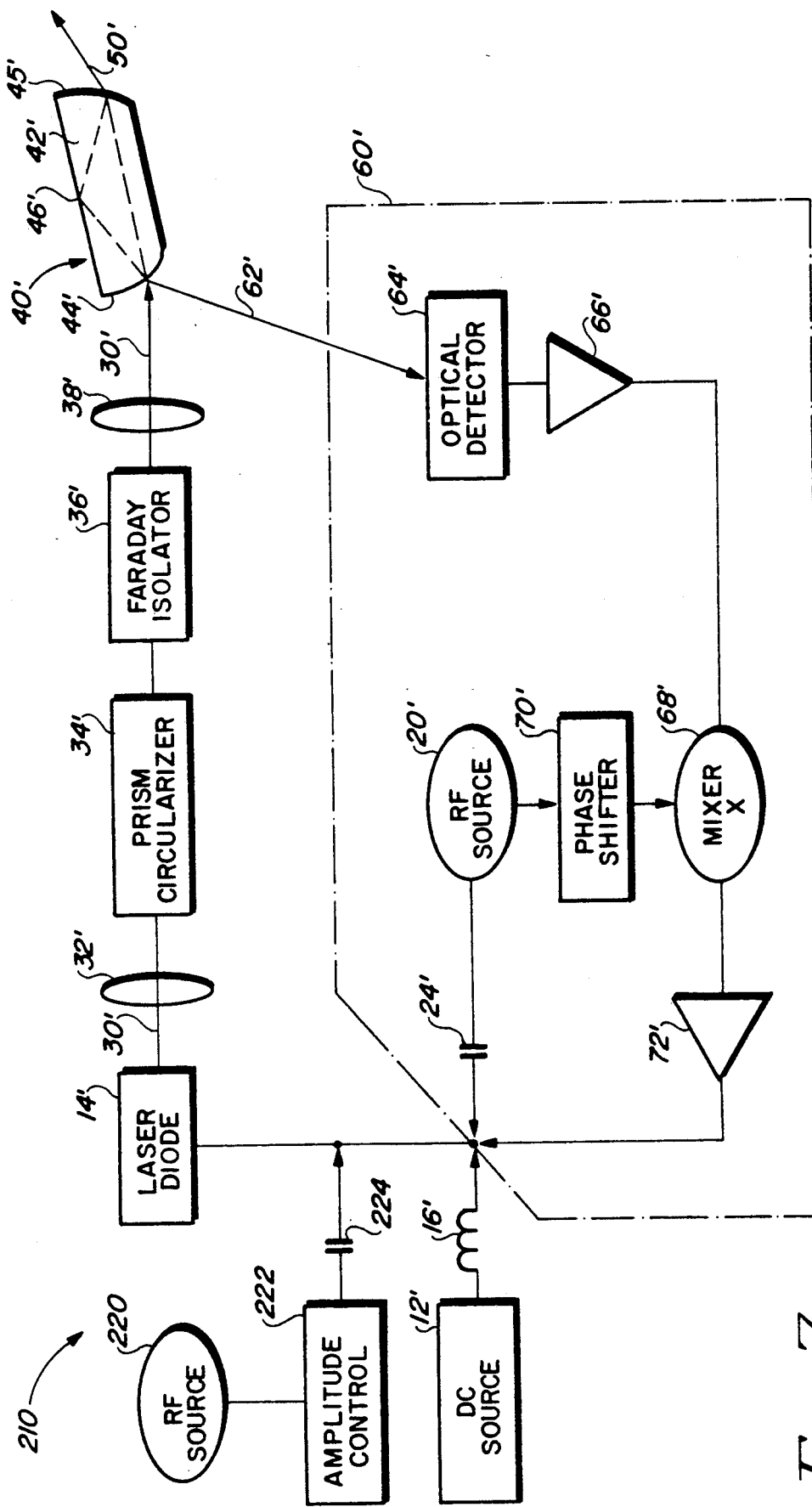
FIG. 7 shows a schematic diagram of an alternative embodiment of the laser system of the present invention.

FIG. 7 shows a schematic diagram of an alternative embodiment of the laser system of the present invention and is designated by the general reference number 210. System 210 produces two sets of sideband components. A first set of sidebands at a first frequency provides the error signal for frequency locking and a second set of sidebands at a second RF frequency provides the pulsing and power adjustment. Elements of system 210 which are similar to elements in system 10 are designated by a prime number. Locking system 60' is similar to system 60 with the exception that the amplitude control 20 is omitted. RF source 20' is connected directly to capacitor 24'.

A second RF source 220 is connected to an amplitude control 222. Amplitude control 222 is similar to amplitude control 22 of system 10. Control 222 is connected to laser diode 14' via the capacitor 224.

Figure 8A:
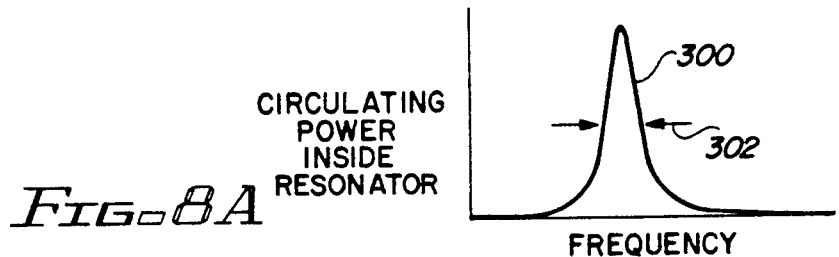
FIG. 8A shows a graph of circulating power versus frequency for the resonator cavity of the system of FIG. 7.

FIG. 8A shows a graph of circulating power versus frequency for the resonator 40' as a line 300. In a preferred embodiment, the FWHM 302 linewidth is 200 MHz.

Figure 8B:
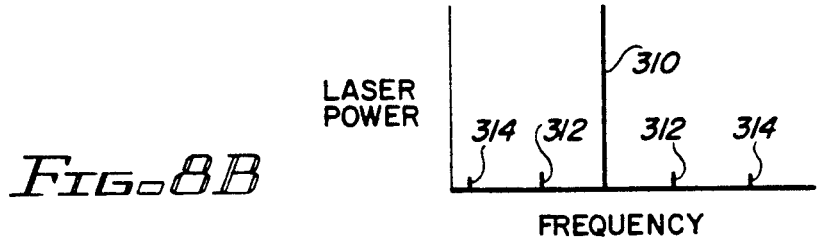
FIG. 8B shows a graph of laser power versus frequency for the laser diode output light beam at a first state in the system of FIG. 7.

FIG. 8B shows a graph of laser power versus frequency for the beam 30' when the RF signal amplitude control 222 is set at a low amplitude. Line 310 represents carrier frequency component and line 312 represent the two sideband frequency components produced by RF source 20'. Line 314 represent the two sideband frequency components produced by RF source 220. The sidebands 312 and 314 are located outside the linewidth of resonator 40' for optimum operation in a preferred embodiment.

Figure 8C:
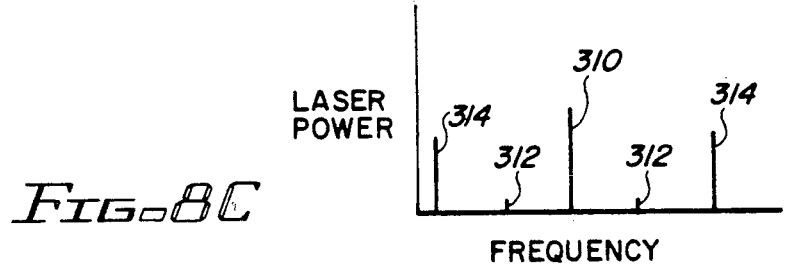
FIG. 8C shows a graph of laser power versus frequency for the laser diode output light beam at a second state in the system of FIG. 7.

FIG. 8C shows a graph of laser power versus frequency for beam 30' when the RF signal from amplitude control 222 is set at a high amplitude. Note that the increase in RF amplitude from amplitude control 222 causes a shift in power from the carrier 310 and sidebands 312 to the sidebands 314.

The operation of system 210 is very similar to that of system 10. The RF source 20' provides a steady RF signal in the range of 400 MHz so as to produce a maximum peak-to-peak RF current in the laser diode 14 of approximately 0.1 to 1.0 mA. This produces the first set of sideband components 312 in light beam 30'. These sidebands 312 are reflected at resonator 40' and are received by locking system 60' to provide the correct tuning of the input current to laser diode 14' in order to lock the carrier 310 to the resonator frequency.

RF source 220 provides an RF signal in the range of 900 MHz. Amplitude control 222 can vary the signal between −5 and 5 dBm. The resulting signal produces the second set of sideband components 314 in light beam 30'. The frequency of RF source 220 is preferrably chosen to be approximately 1.5 to three times the frequency of RF source 20' in order that the second sidebands 314 are substantially different from and do not interfere with locking system 60'. The amplitude control 222 changes the magnitude of sidebands 314 and results in the output 50' being varied between a high and low level output.

The advantages of system 210 is that it allows for very high frequency pulsing. It is convenient to place the locking sidebands 312 close to the carrier frequency. Pulsing speed is limited by the RF cycle time. By adding the second sidebands at a higher RF frequency, the system can be pulsed at that higher frequency without losing the locking signal from the first set of sidebands.

Figure 9:
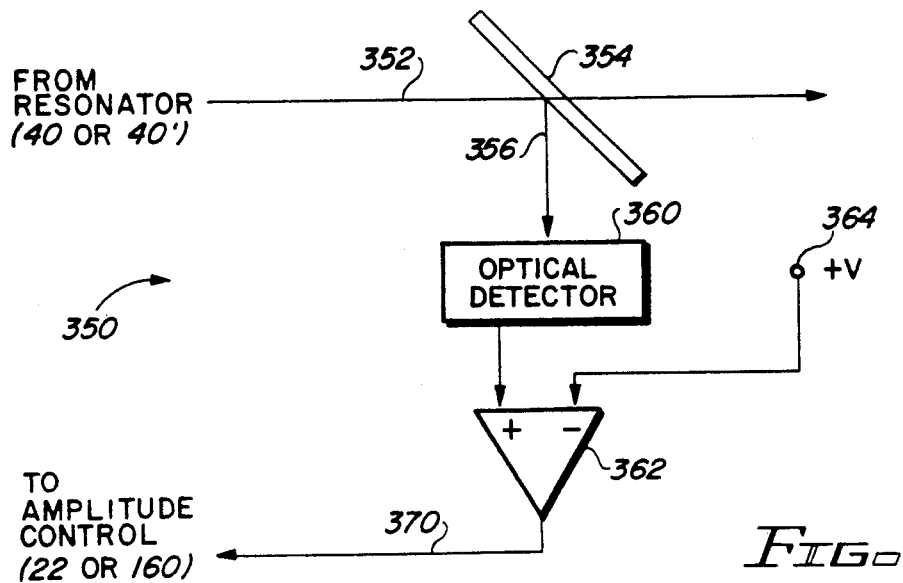
FIG. 9 shows a schematic diagram of an output light power stabilizer of the present invention.

FIG. 9 shows a schematic diagram of a beam stabilization system of the present invention and is designated by the general reference number 350. System 350 may be used to stabilize the blue light output of system 10 or 210 of FIGS. 1 and 7, respectively, against noise or drift due to changes in the overall diode laser power, spatial coupling efficiency from mechanical instability, or changes in the phasematching conditions. A blue light beam 352 is output from either resonator 40 or 40' of systems 10 or 210, respectively. A portion of beam 352 is reflected by a beamsplitter 354 as a beam 356. Beam 356 falls upon an optical detector 360. Optical detector 360 is connected to a differential amplifier 362. A voltage source 364 provides a power setpoint and is connected to differential amplifier 362. Differential amplifier 362 is connected to attenuator 150 of the amplitude control 22 or to the attenuators 162 and 164 of amplitude control 160.

In operation, differential amplifier 362 compares the output of detector 360 to the power setpoint of source 364 and produces a power error signal 370 if the power of beam 352 is not equal to the setpoint from source 364. Error signal 370 is then used as an error signal to control the RF amplitude control 22 or 222 of systems 10 or 210, respectively. An increase in power of beam 352 due to fluctuations in the system, will result in a negative error signal at amplitude control 22 or 160 and result in a decrease in the attenuation of the RF power. The resulting increase in RF power to laser diode 14 or 14' increases the power in the sidebands, decreases the power in the carrier and hence the blue light output. Similarly, a decrease in power of beam 352 due to fluctuations in the system will result in a positive error signal 370 being sent to amplitude control 22 or 160, causing an increase in attenuation of the RF power. The resulting decrease in RF power to laser diode 14 or 14' will decrease the sideband power, increasing the power in the carrier and resulting in more blue light output. By adjusting the RF amplitude control 22 or 160 in this manner, the output level of beam 352 can be controlled while maintaining frequency locking between the laser and the resonator.

Other alternative embodiments of the present invention are possible. For example, in system 210 the locking system 60' may be eliminated and some other locking scheme (such as passive optical feedback locking) may be substituted in its place. The system may still be pulsed or the output varied by varying the amplitude control 222.

Figure 10:
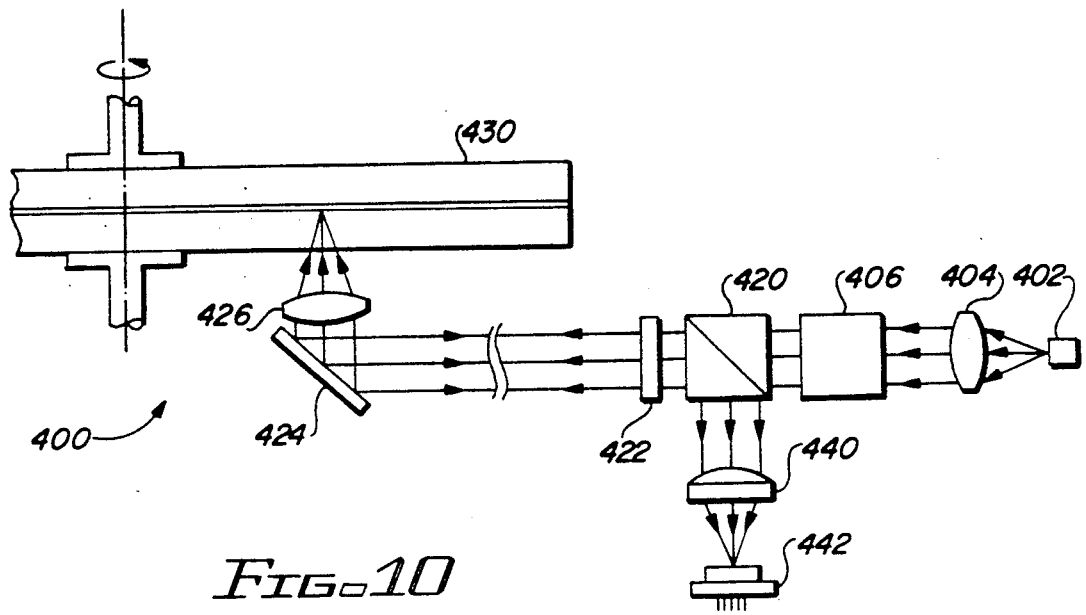
FIG. 10 shows a schematic diagram of a phase change optical storage system.

One application of this pulsed blue light source is in an optical recording system. FIG. 10 shows a phase change optical disk drive system 400 which uses a laser system 402. Laser system 10 or 210 may be used for laser system 402. The output light from system 402 is collimated by a lens 404 and passes to a circularizing optical element 406. Element 406 emits light having a circular cross-sectional beam pattern. Element 406 may be a prism.

The light then passes through a polarizing beam splitter 420 and a quarter-waveplate 422. The light is reflected off of a mirror 424 and is focused by a lens 426 onto an optical recording medium 430. Medium 430 may be a phase change type of optical recording medium.

The light reflected from medium 430 returns through lens 426, is reflected off of mirror 424, and passes through plate 422 to beamsplitter 420. Reflected light is then diverted by beamsplitter 420 to an astigmatic lens 440. Lens 440 focuses the reflected light onto an optical detector 442. The recorded spots of the medium 240 have different reflectivities and these differences are detected by optical detector 442 as data ones and zeros. Detector 442 also provides tracking and focus signals.

Figure 11:
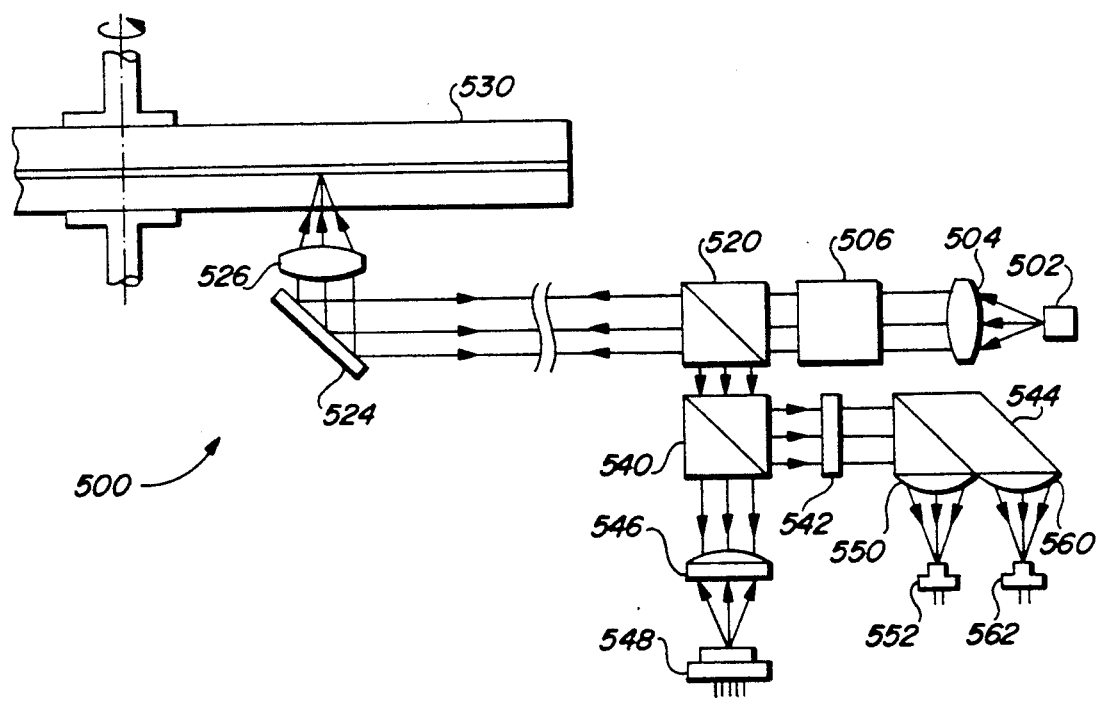
FIG. 11 shows a schematic diagram of a magneto-optic storage system.

FIG. 11 shows a magneto-optic disk drive system 500 which uses a laser system 502. Laser system 10 or 210 may be used for system 502. The light output from system 502 is collimated by a lens 504 and passes to a circularizing element 506. Element 506 emits light having a circular cross-sectional beam pattern. Element 506 may be a prism.

The light then passes through a leaky polarizing beamsplitter 520. Beamsplitter 520 has reflectivities $R_p > 0$ and $R_s$ approximately equal to one. (p and s represent the orthogonal polarized components of the light). The light is then reflected off of a mirror 524 to a lens 526 and is focused onto an optical recording medium 530. Medium 530 may be a magneto-optic type of optical recording medium.

The light reflected from medium 530 returns through lens 526 reflects off of mirror 524, and enters beamsplitter 520. Beamsplitter 520 diverts the reflected light to an amplitude beamsplitter 540. Reflected data light is diverted to a half waveplate 542 and a beamsplitter 544. Reflected light of other amplitudes passes straight through beamsplitter 540. This light is focused by an astigmatic lens 546 to a quad-detector 548 to produce tracking and focus signals.

The medium 530 has recorded spots having either an up or a down magnetic domain. The plane of polarization of light reflected off of these spots is rotated one way or the other depending upon the direction of the magnetic domain of the spot. Beamsplitter 544 separates the reflected light depending upon which way the plane of polarization has been rotated. The separated beams go to a lens 550 and an optical detector 552 or to a lens 560 and an optical detector 562. The difference in output signals of detectors 552 and 562 are the data ones and zeros. A more detailed explanation of optical disk drive systems is given in "Gradient-Index Optics and Miniature Optics," SPIE, Vol. 935, p. 63 (1988), by Glenn Sincerbox.

Optical storage systems such as shown in FIG. 10 and 11 require write pulses of approximately 10 nanoseconds duration for data rates up to 10 megabytes per second. In optical storage systems the blue write pulses must be approximately 4 to 5 times the power of the blue read pulses. This difference in blue light power can be obtained by varying the carrier power of beam 30 by a factor of 3 to 4. A RF current of a few milliamps is sufficient to reduce the power at the carrier frequency component by this amount and shift this power to the sidebands. This relatively small modulation of the RF current (a few milliamps change versus a DC current of 100-200 milliamps) does not significantly change the frequency of the carrier frequency component and consequently it remains locked to the resonance frequency of the resonator.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A laser system comprising:
   a radiation source for outputting a radiation beam having a carrier frequency component and a sideband frequency component;
   an optical resonator for substantially receiving the carrier frequency component and for substantially rejecting the sideband frequency component; and
   a radiation source control connected to the radiation source for varying the ratio of the sideband frequency component to the carrier frequency component.

2. The system of claim 1 further including:
   a nonlinear crystal located within the resonator for frequency doubling the carrier frequency component radiation.

3. The system of claim 1 further including:
   a carrier frequency adjustment means connected to the radiation source for maintaining the carrier frequency component at approximately the resonance frequency of the resonator.

4. The system of claim 1 further including:
   a radiation detection means connected to the radiation control for receiving a radiation output from the resonator and outputting a power level error signal responsive thereto.

5. The system of claim 1 wherein the laser is a laser diode.

6. A method for controlling the output power of a laser system comprising the steps of:
   generating a radiation beam having a carrier frequency component and a sideband frequency component;
   directing the radiation beam to an optical resonator, the resonator substantially receiving the carrier frequency component, substantially rejecting the sideband frequency component, and outputting a resonated radiation beam; and
   varying the ratio of the sideband frequency component to the carrier frequency component.

7. The method of claim 6 further including the step of:
   passing said carrier frequency component radiation through a nonlinear crystal located within the resonator to double the carrier frequency component.

8. The method of claim 6 further including the step of:
   sampling a portion of the sideband frequency radiation and adjusting the carrier frequency component frequency responsive thereto.

9. A laser system comprising:
   a radiation source for outputting a radiation beam having a carrier frequency component and a sideband frequency component;
   an optical resonator for substantially receiving the carrier frequency component and for substantially rejecting the sideband frequency component; and
   a radiation source control connected to the radiation source for varying the radiation beam between a first and a second state, the first state having a maximum carrier frequency component and a minimum sideband component and the second state having a minimum carrier frequency component and a maximum sideband frequency component.

10. The system of claim 9 further including:
    crystal located within the resonator for frequency doubling the carrier frequency component radiation.

11. The system of claim 9 further including:
    a carrier frequency adjustment means connected to the radiation source for maintaining the carrier frequency component at approximately the resonance frequency of the resonator.

12. The system of claim 9 further including:
    a radiation detection means connected to the radiation control for receiving a radiation output from the resonator and outputting a power level error signal responsive thereto.

13. The system of claim 9 wherein the laser is a laser diode.

14. A method for controlling the output power of a laser system comprising the steps of:
    generating a radiation beam having a carrier frequency component and a sideband frequency component;
    directing the radiation beam to an optical resonator, the resonator substantially receiving the carrier frequency component, substantially rejecting the sideband frequency component, and outputting a resonated radiation beam; and
    varying the radiation beam between the first and a second state, the first state having a maximum carrier frequency component and a minimum sideband frequency component and the second state having a minimum carrier frequency component and a maximum sideband frequency component.

15. The method of claim 14 further including the step of:
    passing said carrier frequency component radiation through a nonlinear crystal located within the resonator to double the carrier frequency component.

16. The method of claim 14 further including the step of:

sampling a portion of the sideband frequency radiation and adjusting the carrier frequency component frequency responsive thereto.

17. A laser system comprising:
a DC power source for generating a DC power signal;
a RF power source for generating a RF power signal;
a laser connected to the DC power source and RF power source, for receiving said DC power signal and RF power signal and generating a radiation beam responsive thereto, said radiation beam comprised of a carrier frequency component and a sideband frequency component;
an optical resonator for receiving said radiation beam; and
a RF power control connected to the RF source for varying the RF power signal amplitude.

18. The laser system of claim 17 further including:
a nonlinear crystal located within the resonator.

19. The system of claim 18 wherein the nonlinear crystal is potassium niobate (KNbO$_3$).

20. The system of claim 17 further including:
an optical detector for receiving a portion of said sideband frequency component and generating a detector signal responsive thereto;
a mixer connected to the laser, RF power source, and the optical detector, for mixing the RF signal from the RF power source and the detector signal from the detector to generate an error signal.

21. A laser system comprising:
a laser for outputting a radiation beam having a carrier frequency component and a sideband frequency components;
an optical resonator for substantially receiving said carrier frequency component and for substantially rejecting said sideband frequency component;
a laser control connected to the laser for varying the ratio of the sideband frequency component to the carrier frequency component;
an optical recording medium;
an optical transmission means for directing a radiation beam from the resonator to the optical recording medium; and
optical reception means for receiving a reflected radiation beam from the optical recording medium and providing a data signal responsive thereto.

22. The system of claim 21, further including:
a nonlinear crystal located within the resonator for frequency doubling the carrier frequency component radiation.

23. The system of claim 21, further including:
a carrier frequency adjustment means connected to the laser for maintaining the carrier frequency component at approximately the resonance frequency of the resonator.

24. A laser system comprising:
a DC power source for generating a DC power signal;
a RF power source for generating a RF power signal;
a laser connected to the DC power source and RF power source, for receiving said DC power signal and RF power signal and generating a radiation beam responsive thereto, said radiation beam comprised of a carrier frequency component and a sideband frequency component;
an optical resonator for substantially receiving said carrier frequency component of the radiation beam and substantially reflecting said sideband frequency component of the radiation beam;
an optical isolator located between the laser and the resonator for allowing the radiation beam to pass from the laser to the resonator and for preventing radiation from passing through the optical isolator in the opposite direction;
a RF power control connected to the RF power source for varying the RF power signal amplitude;
a nonlinear crystal located within the resonator;
an optical detector for receiving said sideband frequency component from the resonator and generating a detector signal responsive thereto;
a phase shifter connected to the RF power source; and
a mixer connected to the laser, phase shifter and the optical detector, for mixing a RF signal from the phase shifter and the detector signal from the detector and generating an error signal responsive thereto.

25. A laser system comprising:
a DC power source for generating a DC power signal;
a first RF power source for generating a first RF power signal;
a second RF power source for generating a second RF power signal;
a laser connected to the DC power source, the first RF power source and the second RF power source, for receiving said DC power signal and said first and second RF power signals and generating a radiation beam responsive thereto, said radiation beam comprised of a carrier frequency component and a first sideband frequency component and a second sideband frequency component;
an optical resonator for substantially receiving said carrier frequency component of the radiation beam and substantially reflecting said first and second sideband frequency components of the radiation beam;
an optical isolator located between the laser and the resonator for allowing the radiation beam to pass from the laser diode to the resonator and for preventing radiation from passing through the optical isolator in the opposite direction;
a RF power control connected to the second RF power source for varying the second RF power signal amplitude;
a nonlinear crystal located within the resonator;
an optical detector for receiving said first sideband frequency component from the resonator and generating a detector signal responsive thereto;
a phase shifter connected to the first RF power source; and
a mixer connected to a laser, phase shifter and the optical detector, for mixing a RF signal from the phase shifter and the detector signal from the detector and generating an error signal responsive thereto.

* * * * *